(12) United States Patent
Tada et al.

(10) Patent No.: US 8,715,791 B2
(45) Date of Patent: May 6, 2014

(54) METHOD FOR FORMING POROUS INSULATING FILM AND SEMICONDUCTOR DEVICE

(75) Inventors: Munehiro Tada, Tokyo (JP); Naoya Furutake, Tokyo (JP); Tsuneo Takeuchi, Tokyo (JP); Yoshihiro Hayashi, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 639 days.

(21) Appl. No.: 11/991,745

(22) PCT Filed: Sep. 8, 2006

(86) PCT No.: PCT/JP2006/317819
§ 371 (c)(1),
(2), (4) Date: May 12, 2008

(87) PCT Pub. No.: WO2007/032261
PCT Pub. Date: Mar. 22, 2007

(65) Prior Publication Data
US 2010/0219512 A1 Sep. 2, 2010

(30) Foreign Application Priority Data

Sep. 13, 2005 (JP) ................................. 2005-264619

(51) Int. Cl.
*C23C 16/00* (2006.01)
(52) U.S. Cl.
USPC .......................................... 427/585; 427/569
(58) Field of Classification Search
None
See application file for complete search history.

(56) References Cited

U.S. PATENT DOCUMENTS

| | | | | |
|---|---|---|---|---|
| 5,630,878 A * | 5/1997 | Miyamoto et al. | ............ | 118/715 |
| 7,241,704 B1 * | 7/2007 | Wu et al. | ........................ | 438/781 |
| 2001/0053614 A1 * | 12/2001 | Shioya et al. | ................. | 438/778 |
| 2002/0062789 A1 * | 5/2002 | Nguyen et al. | ................. | 118/715 |
| 2004/0096672 A1 * | 5/2004 | Lukas et al. | ................... | 428/446 |
| 2004/0221807 A1 * | 11/2004 | Verghese et al. | ............... | 118/715 |
| 2005/0250348 A1 * | 11/2005 | Xia et al. | ........................ | 438/788 |
| 2005/0267253 A1 * | 12/2005 | Hayashi | ......................... | 524/588 |
| 2007/0093078 A1 | 4/2007 | Harada et al. | | |
| 2007/0122947 A1 * | 5/2007 | Sakurai et al. | ................. | 438/148 |

FOREIGN PATENT DOCUMENTS

| | | |
|---|---|---|
| JP | 2001-332550 | 11/2001 |
| JP | 2002-526916 | 8/2002 |
| JP | 2004-289105 | 10/2004 |
| JP | 2005-51192 | 2/2005 |
| JP | 2005-294333 | 10/2005 |
| JP | 2006-4992 | 1/2006 |
| WO | WO 2005/053009 A1 | 6/2005 |
| WO | WO2005/063685 * | 7/2005 |

OTHER PUBLICATIONS

Japanese Office Action dated Sep. 14, 2010, with English translation.

* cited by examiner

*Primary Examiner* — Joseph Miller, Jr.
(74) *Attorney, Agent, or Firm* — McGinn IP Law Group, PLLC

(57) ABSTRACT

A method for forming porous insulating film using cyclic siloxane raw material monomer, includes forming porous insulating film using the mixed gas of a cyclic organosiloxane raw material and a compound raw material including a part of chemical structure including the cyclic organosiloxane raw material. The compound raw material may include a compound including a part of side chain of the cyclic organosiloxane raw material.

12 Claims, 5 Drawing Sheets

F I G. 1
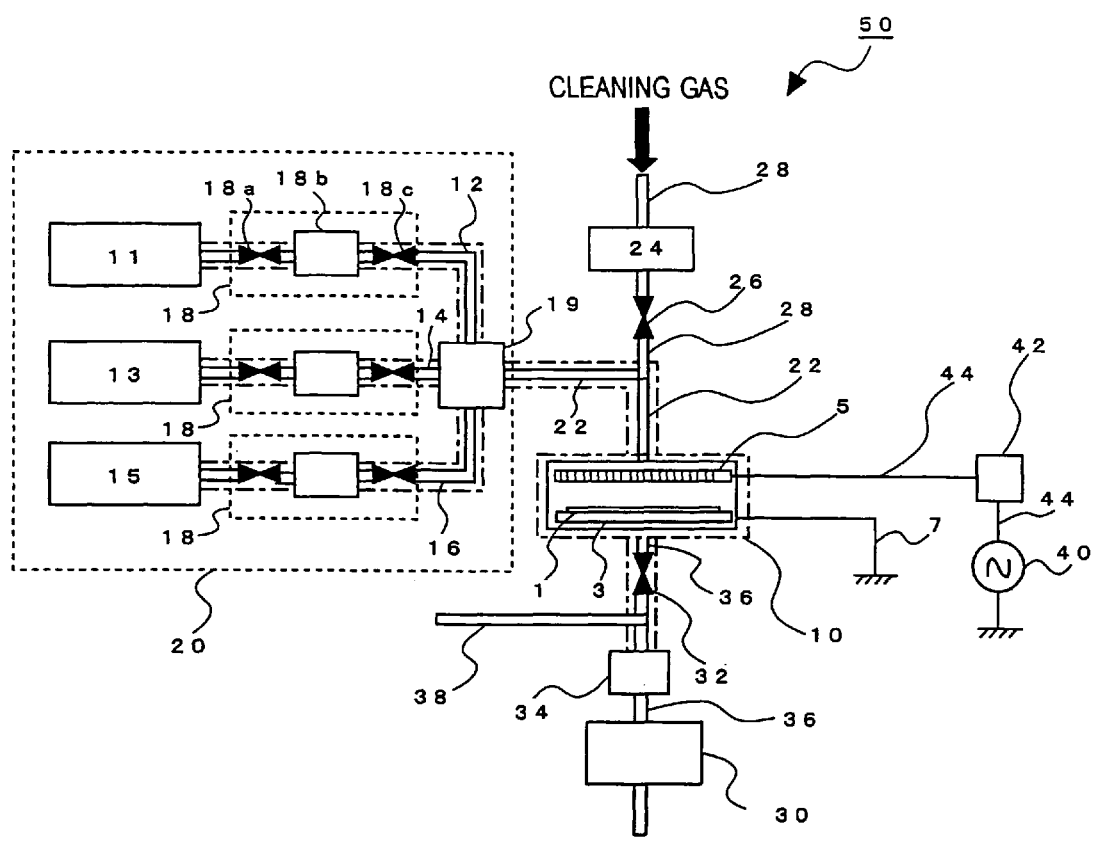

(a)

(b)

(c)

METHOD FOR FORMING POROUS INSULATING FILM AND SEMICONDUCTOR DEVICE

TECHNICAL FIELD

The present invention relates to a method for forming porous insulating film, and in particular, relates to a semiconductor device including a wiring, and a semiconductor device including damascene wiring structure including Cu as principal component.

BACKGROUND ART

In silicon semiconductor integrated circuit (LSI), conventionally, aluminum (Al) or Al alloy has been used extensively as the conductive material. With the recent advance in microfabrication technology used in the method for manufacturing of LSI, and for the purpose of reduction in resistance in the wiring and for improvement of reliability, use of copper (Cu) in the conductive material has begun to appear. Since Cu easily diffuses in a silicon oxide film, according to the prior art, conductive barrier metal film for prevention of diffusion of Cu is provided to side face and bottom face of the Cu wiring, and insulating barrier film is employed at top face of the Cu wiring.

In recent years, progress in microfabrication of LSI resulted in wirings with finer dimensions, and increased capacity between wirings poses a problem, while introduction of porous low-dielectric constant film to interlayer insulating film has been accelerated. This is because employment of multilayer wiring to semiconductor elements allows high-speed and low-power connection, realization of low-dielectric constant features of interlayer insulating film as well as microfabrication are effective, and it is therefore necessary to meet with both requirements.

For the purpose of reduction in effective capacity between wirings, realization of low-dielectric constant features of interlayer insulating film (in this case, silicon oxide film (k=4.2)) is necessary. As low-dielectric constant film, for example, HSQ (Hydrogen Silsesquioxane) film, CDO (Carbon doped oxide) or organic film are included. These are formed by rotation coating method, vapor deposition method or the like.

Patent Document 1 discloses a technology of forming porous insulating film using plasma CVD method. Patent Document 2 describes a technology of forming porous insulating film using cyclic organosiloxane.

Patent Document 1: Japanese Patent Application Laid-Open No. 2004-289105

Patent Document 2: Japanese Patent Application National Publication No. 2002-526916

DISCLOSURE OF THE INVENTION

Problems to be Solved by the Invention

As described in the patent documents, according to the prior art, porous insulating film having specific inductive capacity of approximately 2.6 can be formed by the plasma CVD method using raw materials including cyclic organosiloxane. However, in accordance with microfabrication of LSI developed recently, necessity for a method for forming porous insulating films having specific inductive capacity 2.4 or less is cited, while forming by the plasma CVD method which ensures excellent adhesiveness is particularly desired. However, the prior art has the following drawbacks.

(1) With the technology described in Patent Document 1, a film formation method of cutting-recombination type is used, in which raw material monomers are decomposed in plasma. For this reason, hydrocarbon components bound to raw material monomers are detached, and such a problem arises that reduction in specific inductive capacity is not possible, and limitation of reduction in specific inductive capacity is up to approximately 2.7.

(2) Meanwhile, in the technology which uses cyclic siloxane raw material monomers described in Patent Document 2, cyclic structure of siloxane acts as the framework, specific inductive capacity of approximately 2.6 is obtained, steric hindrance is formed by having isopropyl group at side chain, additional reaction of the monomer is promoted by having vinyl group at side chain, whereby specific inductive capacity of approximately 2.5 can be obtained. However, even in this state, hydrocarbon amount in the film is smaller than that of raw material monomers, and for the purpose of further reduction in specific inductive capacity, a method, which further suppresses detachment of hydrocarbons, maintains framework of raw material siloxane as much as possible, and ensures formation of low-density film, is desired.

The purpose of the present invention is to provide a method for a forming porous insulating film using cyclic siloxane raw material monomers, that is, a method for a forming porous insulating film with reduced specific inductive capacity, and a semiconductor device including porous insulating film being formed by this method.

Means for Solving the Problems

The inventors of the present application investigated methods for a forming porous insulating film and found the above-mentioned method for a forming porous insulating film. The method for a forming porous insulating film of the present invention is characterized by that, in the method for forming insulating film by plasma vapor deposition method, in which at least cyclic organosiloxane raw material is supplied to a reaction chamber, a mixed gas of the cyclic organosiloxane raw material and a compound raw material containing a part of chemical structure comprising the cyclic organosiloxane raw material is used. In other words, energy flux of electrons in the plasma is reduced with the use of the gas in which cyclic organosiloxane raw material and the compound raw material are mixed, and an insulating film is formed while monomer structure of cyclic organosiloxane raw material is maintained. On this occasion, electrons in the plasma lose energy thereof through collision with compound raw materials, probability of destruction of cyclic organosiloxane raw material decreases, and porous insulating film can be formed while cyclic organosiloxane raw material is maintaining raw material structure thereof. In particular, presence of the compound raw material including chemical structure identical with that of the cyclic siloxane raw material in the reaction chamber enables suppression of decomposition of cyclic organosiloxane raw material.

In the meantime, while the mixed gas is in vaporized state, mixing ratio of the compound raw material with regard to 100% by volume of the cyclic organosiloxane raw material is preferably in a range from 5 to 200% by volume.

The method for forming porous insulating film according to the present invention is characterized by that the mixed gas is produced by vaporizing a mixed raw material of the cyclic organosiloxane raw material and the compound raw material. When a raw material, in which cyclic organosiloxane raw material and the compound raw material are mixed with arbitrary ratio, is used, cost reduction can be attained through a simplified film forming device, simplified film forming sequence, and stabilization.

Further, the compound raw material includes a part of side chain of the cyclic organosiloxane raw material. For this reason, if a side chain, that is a detachment component, is caused to be present in advance in the vapor phase, side chain bonding can be thermodynamically stabilized and detachment of side chain that is bonded to cyclic siloxane can be suppressed.

Cyclic organosiloxane raw material has a structure represented by Chemical formula (1) shown below, wherein R1 and R2 are preferably any one or more of methyl group, ethyl group, propyl group, isopropyl group, vinyl group, and allyl group, and specifically, a structure represented by Chemical formula (2), Chemical formula (3), or Chemical formula (4) shown below is preferable.

[Chemical Formula 1]

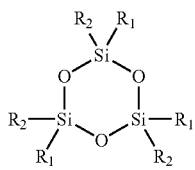

(Chemical formula (1))

[Chemical Formula 2]

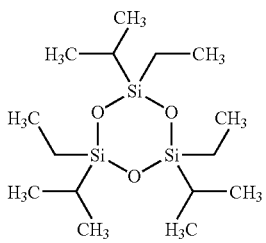

(Chemical formula (2))

[Chemical Formula 3]

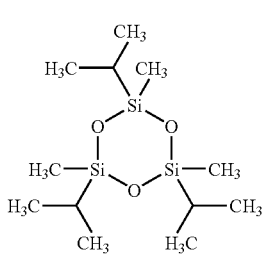

(Chemical formula (3))

[Chemical Formula 4]

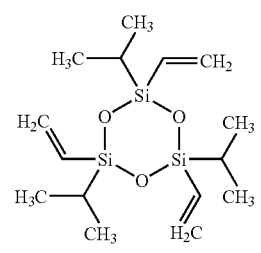

(Chemical formula (4))

Alternatively, the compound raw material preferably includes a reaction precursor of the cyclic organosiloxane, or a compound, in which the compound raw material comprises at least silicon, oxygen, carbon, or hydrogen, having chemical structure represented by the following Chemical formula (5) may be used. Further, two or more of these the compound raw materials may be mixed.

[Chemical Formula 5]

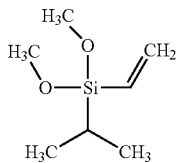

(Chemical formula (5))

In particular, the compound raw material is preferably at least either of methanol, ethanol, propanol, or isopropanol.

When the porous insulating film of the present invention is used as the interlayer insulating film being formed on a substrate on which semiconductor element is formed, low-capacity features between wirings are attained and at the same time, higher insulation reliability is obtained. Specifically, such a semiconductor device is meant that includes insulating film being formed by the plasma vapor deposition method, wherein at least cyclic organosiloxane raw material is supplied to the reaction chamber, which semiconductor device includes porous insulating film being formed by a mixed gas of the cyclic organosiloxane raw material and compound raw material containing a part of chemical structure comprising the cyclic organosiloxane raw material. Further, such a semiconductor device is meant that includes insulating film being formed by the plasma vapor deposition method, wherein at least cyclic organosiloxane raw material is supplied to the reaction chamber, which semiconductor device includes porous insulating film being formed by a mixed gas of the cyclic organosiloxane raw material and compound raw material containing a part of side chain of the cyclic organosiloxane raw material. Further, such a semiconductor device is meant that includes insulating film being formed by the plasma vapor deposition method, wherein at least cyclic organosiloxane raw material is supplied to the reaction chamber, which semiconductor device includes porous insulating film being formed using a mixed gas of the cyclic organosiloxane raw material and compound raw material that is a reaction precursor of the cyclic organosiloxane.

Novel features of the present invention will be better understood from the description of the specification and appended drawings.

Effect of the Invention

With the use of a method for forming porous insulating film and a semiconductor device according to the present invention, low-dielectric interlayer constant film is accomplished and eventually, performances of wirings are improved and formation of LSI with high-speed and low-power consumption features is made possible.

BEST MODE FOR CARRYING OUT THE INVENTION

Before explaining the invention of the present application in greater detail, meanings of terms used herein will be explained.

Low-dielectric constant film denotes, for example, a film for separating wiring members by insulation (interlayer insulating film), and indicates a material with lower specific inductive capacity than silicon oxide film (specific inductive capacity: 4.2) used for the purpose of reduction in the capacity of multilayer wirings connecting semiconductor elements. Particularly, for porous insulating films, for example, material with lower specific inductive capacity (silicon oxide film is made porous), or materials with lower specific inductive capacity produced from HSQ (Hydrogen Silsesquioxane) film, or SiOCH, SiOC (e.g., Black Diamond (registered trademark), CORAL (registered trademark), Aurora (registered trademark)) by making them porous, are mentioned. At present, attainment of further lower dielectric constant of these films is desired.

In the present exemplary embodiment, metallic wiring materials are contained primarily of Cu. For the purpose of improvement of reliability of metallic wiring materials, metallic element other than Cu may be included in the material comprising Cu, or metallic element other than Cu may be formed on top face or side face of Cu.

Damascene wiring denotes a buried wiring produced in such that a metallic wiring material is buried in a groove of interlayer insulating film being formed in advance, and surplus metals other than the groove are removed by CMP or the like. Wiring structure normally employed when a damascene wiring is formed by Cu is such that side face and periphery of Cu wiring are covered by barrier metal, and top face of Cu wiring is covered by insulating barrier film.

CMP (Chemical Mechanical Polishing) method denotes such a method that concavity and convexity on wafer surface generated during multilayer wiring forming process are flattened by polishing by contacting the concavity and convexity to a rotating abrasive pad while abrasive liquid is introducing to the wafer surface. Particularly, in forming wirings by damascene method, this method is used to remove surplus metals after a metal is buried in the wiring groove or via hole and to obtain flat wiring surface.

Barrier metal denotes a conductive film including barrier features used for covering side face and bottom face of the wiring for prevention of diffusion of metallic element, that comprises the wiring, into interlayer insulation film or lower layer. For example, when a wiring comprises metallic elements composed primarily of Cu, high-melting point metals such as tantalum (Ta), tantalum nitride (TaN), titanium nitride (TiN), tungsten carbonitride (WCN), nitride thereof, or their laminated film are used.

Insulating barrier film is formed on top face of Cu wiring, has functions to prevent oxidation of Cu, or diffusion of Cu into insulating film, and acts as etching stop layer at processing. For example, SiC film, SiCN film, SiN film or the like are used.

Semiconductor substrate is a substrate on which is composed a semiconductor device, and includes SOI (Silicon on Insulator) substrate, TFT (Thin film transistor), or substrate for liquid crystal manufacturing, as well as those provided specifically on single crystal silicon substrate.

Hard mask denotes an insulating film which is laminated on the interlayer insulating film and plays a protection role, when performing CMP directly is difficult due to strength reduction by low-dielectric constant of the interlayer insulating film.

Passivation film is formed on the uppermost layer of a semiconductor element and has a role to protect the semiconductor element from moistures from the outside. In the present invention, silicon acid nitride film (SiON) formed by plasma CVD method, polyimide film, or the like are used.

The plasma CVD method is such a method that for example, raw material in gaseous state is supplied continuously to reaction chamber under reduced pressure, molecules are put into excitation state by plasma energy, and a continuous film is formed on a substrate by vapor phase reaction, or substrate surface reaction, or the like.

For PVD method, although ordinary sputtering method may be used, if improvement of burying characteristics, improvement of film quality, uniformity of film thickness in wafer plane are taken into considerations, sputtering method which ensures good directivity such as long throw sputtering method, collimate sputtering method, ionized sputtering method may also be used. When sputtering an alloy, a metal other than principal component is caused to be contained in advance in a metal target within solid solubility limit to obtain an alloy film from metal film being formed. In the present invention, this method may be used for forming Cu seed layer or forming barrier metal layer when damascene Cu-wiring is primarily formed.

TDDB (Time Dependent Dielectric Breakdown) service life is a method for predicting a time till occurrence of insulation destruction by accelerated test. For example, when TDDB service life of between wirings is measured, a comb type TEG (Test Element Group) is used, a comparatively high electric field of approximately from 1 to 4 MV/cm is applied under measurement conditions of a predetermined temperature (e.g., 125° C.), and leakage current flowing between the wirings is monitored. Measurement of a time from electric field application start till insulation destruction allows comparison of superiority or inferiority of TDDB service life.

(Cyclic Organosiloxane Raw Material and Compound Raw Material)

The following description deals with cyclic organosiloxane raw material and compound raw material used in the method for a forming porous insulating film of the present invention.

Cyclic organosiloxane raw material is a compound represented by Chemical formula (1) shown previously. Alkyl group R1, R2 in Chemical formula (1) are methyl group, ethyl group, propyl group, isopropyl group, vinyl group, allyl group, or the like. Specifically, the cyclic organosiloxane raw material is preferably compound represented by Chemical formulae (2) to (4) shown previously.

Specifically, the compound raw material is preferably a compound including a part of chemical structure comprising the cyclic organosiloxane raw material, and a compound including side chain (alkyl group bound to Si, or the like) of the cyclic organosiloxane raw material is particularly preferable. For example, the cyclic organosiloxane raw material in Chemical formula (1) is a compound including each of alkyl groups R1, R2. The cyclic organosiloxane raw material in Chemical formula (2) is a compound including ethyl group and isopropyl group, the cyclic organosiloxane raw material in Chemical formula (3) is a compound including methyl group and isopropyl group, the cyclic organosiloxane raw material in Chemical formula (4) is a compound including vinyl group, isopropyl group, and propyl group or the like.

Compound materials may be alcohols in which alcohol group is bound to the compounds, and in particular, methanol, ethanol, propanol, isopropanol (IPA), or the like are mentioned. Further, compound raw materials may be alkane (methane series hydrocarbon), alkene (ethylene series hydrocarbon), alkine (acethylene series hydrocarbon) or the like in which H— or further $CH_3$— or the like are bound to the compounds. Specifically, compound raw materials may be methan, ethan, propane, ethylene, acetylene, or the like. In addition, compound materials may be benzene, trimethylbenzene, naphthalene, or the like.

Further, the compound raw material is preferably a reaction precursor of the cyclic organosiloxane raw material. In other words, the cyclic organosiloxane is obtained by causing the reaction precursor to react. The reaction precursor of this cyclic organosiloxane raw material is a compound including a part of skeleton of the cyclic organosiloxane raw material and includes at least hydrogen, carbon, oxygen, silicon. The reaction precursor represented by above-mentioned Chemical formula (4) that is cyclic organosiloxane raw material is represented by above-mentioned Chemical formula (5), and therefore, if these cyclic organosiloxane raw materials and reaction precursor thereof are used as the mixed raw materials for forming of porous insulating film, forming of porous insulating film with lower dielectric constant becomes possible.

For above-shown compound raw material, one of above-mentioned compounds or two or more above-mentioned compounds may be used.

Although mixing ratio of cyclic organosiloxane raw material and compound raw material is not specifically limited, in a state where each of raw materials is vaporized, about 5 to 200% by volume of compound raw material with regard to 100% by volume of cyclic organosiloxane raw material is preferable. While a mixed gas of cyclic organosiloxane raw material and compound raw material is introduced to the reaction chamber (described later) for forming of porous insulating film, each of raw material gas of the cyclic organosiloxane raw material and compound raw material may be mixed in the reaction chamber, or liquid raw material being mixed in a step prior to the reaction chamber (mixed raw material) is vaporized by a vaporizer and mixed gas thus produced may be used, or raw materials vaporized in the step prior to the reaction chamber are mixed in the vaporizer and mixed gas thereof may be used.

(First Exemplary Embodiment)

In the present invention, in the method for forming porous insulating film preferable for interlayer insulating film by the plasma vapor deposition method while supplying at least cyclic organosiloxane raw material to reaction chamber, forming is made possible with the use of a mixed gas of cyclic organosiloxane raw material and compound raw material.

A first exemplary embodiment for forming porous insulating film while supplying a vaporized raw material supplied to a reaction chamber, will be explained hereunder referring to FIG. 1.

FIG. 1 is a schematic view showing one example of plasma CVD device which can be used for a forming porous insulating film (film forming) based on the method of the present invention. A plasma CVD device 50 shown in FIG. 1 includes a reaction chamber 10, a gas supplying section 20, a vacuum pump 30, and a high-frequency power supply 40. The gas supplying section 20 is connected to the reaction chamber 10 by a gas supplying pipe 22, and the vacuum pump 30 is connected to the reaction chamber 10 by a valve 32 and an exhaust pipe 36 with a cooling trap 34 mounted midway. The high-frequency power supply 40 is connected to the reaction chamber 10 by a high-frequency cable 44 with a matching box 42 mounted midway.

In the reaction chamber 10, a substrate heating section 3 which holds and heats a formed film member 1 such as semiconductor substrate, and a shower head 5 to which one end of the gas supplying pipe 22 is connected and which functions as gas blowing section are disposed each in opposed state. A ground wire 7 is connected to the substrate heating section 3, and the high-frequency cable 44 is connected to the shower head 5. Therefore, gas in a space between the substrate heating section 3 and the shower head 5 can be turned to plasma while raw material gas or the like is supplied from the gas supplying section 20 to the shower head 5 via the gas supplying pipe 22 and at the same time, high-frequency power generated by the high-frequency power supply 40 is supplied to the shower head 5 after a predetermined frequency is allocated thereto by a matching box 42 disposed along the way of the high-frequency cable 44.

The gas supplying section 20 includes raw material gas supply tanks as many as the number depending on the number of types of cyclic organosiloxane raw material gases to be used, supply tanks as many as the number depending on the number of types of compound raw materials to be used, gas supply tanks for carrier gas or dilution gas (hereafter referred to as "carrier gas supply tank"), and further includes a mixer 19 for mixing gases being supplied by each tank.

One end of the gas supplying pipe 22 is connected to the mixer 19. In FIG. 1 are shown one cyclic organosiloxane raw material gas supply tank 11, one compound raw material gas supply tank 13, and one carrier gas supply tank 15. The cyclic organosiloxane raw material gas supply tank 11 is connected to the mixer 19 by a piping 12, and the compound raw material gas supply tank 13 is connected to the mixer 19 by a piping 14, and the carrier gas supply tank 15 is connected to the mixer 19 by a piping 16. Two valves 18a, 18b and a gas flow rate control section 18 equipped with a gas flow rate controller 18c disposed between the valves 18a, 18b are provided in each of the piping of 12, 14, 16.

Meanwhile, a cleaning gas supplying pipe 28 to which are disposed a flow rate controller 24 and a valve 26 is connected to the gas supplying pipe 22 midway, and a waste fluid piping 38 is branched between the valve 32 in the gas exhaust pipe 36 and the cooling trap 34. It is preferable to provide a heater (not shown) for prevention of liquefaction of each gas in the transfer step around each of the piping 12, 14, 16 in the gas supplying section 20, and around gas supplying pipe 22, and these piping 12, 14, 16 or the gas supplying pipe 22 are preferably heated. Similarly, it is preferable to provide a heater (not shown) around the reaction chamber 10 for the purpose of heating of the reaction chamber 10.

In the method of forming organic silicon series film by the plasma CVD device 50, first, the formed film member 1 such as semiconductor substrate is disposed on the substrate heating section 3, the vacuum pump 30 is operated while the valve 32 is opened to attain initial vacuum degree in the reaction chamber 10 down to several Torr. Moisture in the gas exhausted from the reaction chamber 10 is removed by the cooling trap 34. Subsequently, raw material gas (gaseous cyclic organosiloxane gas) and compound gas are supplied from the gas supplying section 20 to the reaction chamber 10 together with carrier gas or dilution gas, and at the same time, the high-frequency power supply 40 and the matching box 42 are operated to supply high-frequency electric power at a predetermined frequency to the reaction chamber 10.

On this occasion, flow rate of each of gases is controlled by the corresponding flow rate controller 18, a mixed gas with a predetermined composition is generated by the mixer 19 and is supplied to the reaction chamber 10. Partial pressure of the raw material gas in the reaction chamber 10 is preferably selected appropriately within a range about from 0.1 to 3 Torr. Ambient pressure of the reaction chamber 10 at film forming is preferably set within a range about from 1 to 6 Torr by controlling the vacuum pump 30. Surface temperature of the formed film member 1 at film forming can be set appropriately within a range from 100 to 400° C. by heating the formed film member 1 by the substrate heating section 3, and from 250 to 350° C. is particularly preferable. As explained previously, compound raw material is supplied to the reaction chamber 10 prior to supplying of raw material gas, depending on the type thereof.

When film forming is carried out under such conditions, molecules of cyclic organosiloxane raw material that is a raw material gas are energized by plasma, reaching surface of the formed film member 1 in activated state, and porous insulating film is formed here. When the porous insulating film has a group with unsaturated bond, molecules of the organic silicon compound energized and then activated by plasma reach the surface of the formed film member 1, and receives further thermal energy from the substrate heating section 3, and therefore, the unsaturated bond in the above-mentioned group is ring-opened, thermal polymerization reaction proceeds among molecules, whereby porous insulating film is grown.

For cleaning of the reaction chamber 10, gases such as nitrogen trifluoride ($NF_3$), sulfur hexafluoride ($SF_6$), tetrafluoromethane ($CF_4$), hexafluoroethane ($C_2F_6$) may be used, and these gases may be used, as necessary, as the mixed gas with oxygen gas, ozone gas, or the like. The cleaning gas is supplied to the reaction chamber 10 via the cleaning gas supplying pipe 28. In similar fashion as observed at film forming, high-frequency electric power is applied across the shower head 5 and the substrate heating section 3 to induce plasma, and cleaning of the reaction chamber 10 is carried out. Use of cleaning gas put in advance into plasma state with the use of remote plasma or the like is also effective.

(Second Exemplary Embodiment)

Hereafter, a second exemplary embodiment of the present invention, in which vaporized raw material is supplied to a reaction chamber to form porous insulating film, will be explained referring to FIG. 2. FIG. 2 is a schematic diagram showing one example of important part of a gas supplying section preferably used for a case where boiling point of cyclic organosiloxane intended to be used as the raw material gas is low, and the cyclic organosiloxane may become liquid state unless artificial heating is provided.

The cyclic organosiloxane raw material and compound raw material are mixed with arbitrary ratio, and the mixture is supplied from the gas supplying system 20 as mixed raw material 100.

A vaporization control unit VU includes a raw material tank 102 for accommodating the mixed raw material 100 in liquid state, a pressurized gas supplying device 106 for supplying pressurized gas into a raw material tank 102 via a pressurized gas supplying pipe 104, a mixed raw material transfer pipe 108 inserted one end thereof in the raw material tank 102, a liquid flow rate control section 110 provided in the middle of the mixed raw material transfer pipe 108, a vaporization section 112 disposed to other end of the mixed raw material transfer pipe 108. Above-mentioned liquid flow rate control section 110 includes two valves 110a, 110b, and a liquid flow rate control section 110c disposed between the valves 110a and 110b, and above-mentioned vaporization section 112 includes a valve 112a provided at above-mentioned other end side of the mixed raw material transfer pipe 108, and a vaporizer 112b connected to above-mentioned other end of the mixed raw material transfer pipe 108.

Further, each vaporization control units VU includes a gas supplying tank 114 for carrier gas or dilution gas (hereafter referred to as "carrier gas supplying tank 114"), a piping 116 for supplying the carrier gas or dilution gas in the carrier gas supplying tank 114 to the mixed raw material transfer pipe 108 at between the liquid flow rate control section 110 and a vaporization section 120. In the middle of the piping 116 is provided a gas flow rate control section 118 which includes two valves 118a, 118b, and a gas flow rate controller 118c being disposed between the valves 118a, 118b.

When a pressurized gas is supplied from the pressurized gas supplying device 106 into raw material tank 102 via the pressurized gas supplying pipe 104, internal pressure of the raw material tank 102 increases, the mixed raw material 100 in liquid state in the raw material tank 102 is transferred towards the vaporization section 112 via the mixed raw material transfer pipe 108, and reaches the vaporization section 112 while merging carrier gas or dilution gas on the way. The mixed raw material 100 in liquid state reached the vaporization section 112 is vaporized due to pressure reduction at introduction section of the vaporization section 112 and heating by a heater (not shown).

Use of such a vaporization system enables realization of uniform vaporization even with mixed raw materials.

A mixed gas generated by the vaporization control unit UV is sent to a gas exhaust pipe 120 which is connected to the vaporization section 112. The mixed gas then reaches a mixer 140 via a piping 124. When other raw material gas or additive gas or the like needs to be mixed further, mixing by the mixer 140 is possible.

From a viewpoint of smooth vaporization by each of vaporizers 112b, a heater is preferably provided around the mixed raw material transfer pipe 108 downstream from the valve 110c in the liquid flow rate control section 110, and the mixed raw material transfer pipe 108 is preferably heated. Similarly, for the purpose of prevention of liquefaction of each gas, a heater is preferably provided also around each gas exhaust pipes 120, 152, and the mixer 140 for heating them.

With the use of a film forming device including a gas supplying section comprising above-mentioned composition, desired porous insulating film can be obtained easily even a case where boiling point of a component comprising a mixed raw material intended to be used as the raw material gas is low, and the mixed raw material becomes liquid state unless artificial heating is provided.

(Third Exemplary Embodiment)

Hereafter, a third exemplary embodiment of the present invention, in which vaporized raw material is supplied to a reaction chamber to form porous insulating film, will be explained referring to FIG. 3. FIG. 3 is a schematic diagram showing one example of important part of the gas supplying section preferably used for a case where boiling point of cyclic organosiloxane intended to be used as the raw material gas is low, and the cyclic organosiloxane may become liquid state unless artificial heating is provided.

Cyclic organosiloxane raw material and compound raw material may be prepared in separate raw material tanks and mixed with arbitrary ratio each via a flow meter. Cyclic organosiloxane raw material 101 and compound raw material 103 are supplied from the raw material supplying system 20, respectively.

A vaporization control unit VU1 includes the raw material tank 102 for accommodating cyclic organosiloxane raw material 101 in liquid state, the pressurized gas supplying device 106 for supplying pressurized gas into the raw material tank 102 via the pressurized gas supplying pipe 104, the raw material transfer pipe 108 inserted one end thereof in the raw material tank 102, the liquid flow rate control section 110 provided in the middle of the raw material transfer pipe 108, the vaporization section 112 disposed to other end of the raw material transfer pipe 108. Above-mentioned liquid flow rate control section 110 includes two valves 110a, 110b, and the liquid flow rate controller 110c disposed between the valves 110a and 110b, and above-mentioned vaporization section 112 includes a valve 112a provided at above-mentioned other end side of the raw material transfer pipe 108, and a vaporizer 112b connected to above-mentioned other end of the raw material transfer pipe 108.

Further, each of vaporization control units VU1, VU1 includes the gas supplying tank 114 for carrier gas or dilution gas (hereafter referred to as "carrier gas supplying tank 114"), the piping 116 for supplying the carrier gas or dilution gas in the carrier gas supplying tank 114 to the raw material transfer pipe 108 at between the liquid flow rate control section 110 and vaporization section 120. In the middle of the piping 116 is provided the gas flow rate control section 118 which includes two valves 118a, 118b, and the gas flow rate controller 118c being disposed between the valves 118a, 118b.

With the vaporization control unit VU1, when a pressurized gas is supplied from the pressurized gas supplying device 106 into raw material tank 102 via the pressurized gas supplying pipe 104, internal pressure of the raw material tank 102 increases, the cyclic organosiloxane raw material 101 in liquid state in the raw material tank 102 is transferred towards the vaporization section 112 via the raw material transfer pipe 108, and reaches the vaporization section 112 while merging carrier gas or dilution gas on the way. The cyclic organosiloxane raw material 101 in liquid state reached the vaporization section 112 is vaporized due to pressure reduction at introduction section of the vaporization section 112 and heating by a heater (not shown).

Meanwhile, the vaporization control unit VU2 includes the raw material tank 102 for accommodating the compound raw material 103 in liquid state, the pressurized gas supplying device 106 for supplying pressurized gas into the raw material tank 102 via the pressurized gas supplying pipe 104, the raw material transfer pipe 108 inserted one end thereof in the raw material tank 102, the liquid flow rate control section 110 provided in the middle of the mixed raw material transfer pipe 108, the vaporization section 112 disposed to other end of the raw material transfer pipe 108.

Gasses generated by the vaporization control units VU1, VU2 are sent to the gas exhaust pipe 120 which is connected to the vaporization section 112. The gases then reach the mixer 140 via the piping 124 and are mixed.

From a viewpoint of smooth vaporization by each of vaporizers 112b, a heater is preferably provided around the raw material compound transfer pipe 108 downstream from the valve 110c in the liquid flow rate control section 110, and the raw material compound transfer pipe 108 is preferably heated. Similarly, for the purpose of prevention of liquefaction of each gas, a heater is preferably provided also around each of gas exhaust pipes 120, 152, and the mixer 140 for heating them.

With the use of a film forming device including a gas supplying section including above-mentioned composition, desired porous insulating film can be obtained easily even a case where boiling point of a raw material intended to be used as the raw material gas is low, and artificial heating is not provided.

EXAMPLES 1, 2 AND COMPARATIVE EXAMPLE 1

As an example of the present invention, a case, where a raw material including chemical structure as represented by Formula (4) is used as the cyclic organosiloxane raw material, and isopropyl alcohol (IPA) is used as the compound raw material, will be described in greater detail. A plasma CVD device of parallel flat plate type as shown in the first exemplary embodiment was used as the film forming device, and a system for mixed raw material as shown in the second exemplary embodiment was used as a raw material system.

Cyclic organosiloxane raw material (Chemical Formula (4)) and IPA are mixed in advance with arbitrary ratio, and are supplied from the raw material supplying system to the reaction chamber as the mixed raw material. Heating temperature at the vaporizer can be set in a range from 80 to 120° C. for the purpose of improvement of vaporization efficiency while suppressing thermal polymerization of raw material, and in this example, the temperature was set to 115° C.

A plasma CVD device for 200 mm wafer was used, substrate temperature was 350° C., distance between electrodes was set to 10 mm, and high-frequency electric power at 13.56 MHz was employed. Table 1 shows experimental conditions and results obtained from Examples 1, 2, Comparative example 1 where an insulating film is formed on the silicon substrate. Specific inductive capacity of the film was measured by a mercury probe, and C/Si ratio of the film was obtained by RBS.

It is confirmed that in Example 1 in which IPA was mixed, specific inductive capacity became smaller as compared to Comparative example 1 in which IPA was not mixed, and in Example 2 in which IPA ratio was high, specific inductive capacity became further smaller. It is considered that this finding is attributable to that detachment of isopropyl group being bound as the side chain of the cyclic organosiloxane raw material represented by Chemical Formula (4) was suppressed by mixing of IPA, thereby contributing to lower specific inductive capacity.

TABLE 1

|  | Comparative example 1 | Example 1 | Example 2 |
| --- | --- | --- | --- |
| Chemical Formula (4) | 65 | 65 | 65 |
| IPA | 0 | 5 | 35 |
| Mixing ratio (%) | 0 | 7 | 35 |
| He (sccm) | 300 | 300 | 300 |
| RF (W) | 100 | 100 | 100 |
| Pressure (Torr) | 2.7 | 2.7 | 2.7 |
| Specific inductive capacity | 2.45 | 2.42 | 2.35 |
| C/Si ratio in film | 3.17 | 3.2 | 3.25 |

EXAMPLES 3, 4, COMPARATIVE EXAMPLE 2

As an example of the present invention, a case, where raw material including chemical structure represented by Chemical Formula (4) is used as the cyclic organosiloxane raw material, and one represented by Chemical Formula (5) is used as the compound raw material, will be described in greater detail. A plasma CVD device of parallel flat plate type as shown in the first exemplary embodiment was used as the film forming device, and a system for mixed raw material as shown in the second exemplary embodiment was used as the raw material supplying system.

Cyclic organosiloxane raw material (Chemical Formula (4)) and compound raw material (Chemical Formula (5)) are mixed in advance with arbitrary ratio, and are supplied from the raw material supplying system as the mixed raw material. Heating temperature at the vaporizer can be set in a range from 80 to 120° C. for the purpose of improvement of vaporization efficiency while suppressing thermal polymerization of raw material, and in this example, the temperature is set to 115° C. Since the compound raw material (Chemical Formula (5)) contains smaller number of vinyl groups as compared to cyclic organosiloxane raw material (Chemical Formula (4)), polymerization is hardly promoted at higher temperature, and a large quantity of compound raw materials can be supplied easily to the reaction chamber.

A plasma CVD device for 200 mm wafer was used, substrate temperature was 350° C., distance between substances was set to 14 mm, and high-frequency electric power at 13.56 MHz was employed. Table 2 shows experimental conditions and results obtained from Examples 3, 4, Comparative example 2 where an insulating film is formed on the silicon substrate.

It is confirmed that in Example 3 in which compound raw material was added, specific inductive capacity became smaller as compared to Comparative example 2 in which compound raw material was not added, and in Example 4 in which ratio of compound raw material is high, specific inductive capacity became further smaller.

TABLE 2

|  | Comparative example 2 | Example 3 | Example 4 |
|---|---|---|---|
| Chemical Formula (4) | 65 | 65 | 65 |
| Chemical Formula (5) | 0 | 15 | 35 |
| Mixing ratio (%) | 0 | 18.8 | 35 |
| He (sccm) | 300 | 300 | 300 |
| RF (W) | 100 | 100 | 100 |
| Pressure (Torr) | 2.7 | 2.7 | 2.7 |
| Specific inductive capacity | 2.45 | 2.41 | 2.38 |

EXAMPLE 5

In Example 5 of the present invention, wiring structure for a case, where porous insulating film formed according to the present invention is used for multilayer wiring on a semiconductor substrate on which are formed semiconductor elements, will be explained in greater detail.

As shown in FIG. 4(a), a metallic wiring material 210a, an insulating barrier film 211 are laminated on the semiconductor substrate (not shown) on which are formed semiconductor elements, and a via interlayer insulating film 212, an wiring interlayer insulating film 213 are formed thereon.

Here, although the metallic wiring material 210a is composed primarily of Cu, metallic element other than Cu may be included in the material including Cu for the purpose of improvement of reliability of metallic wiring materials, or metallic element other than Cu may be formed on top face or side face of Cu.

Here, the insulating barrier film 211 includes SiN, SiCN, SiC film, or the like, film thickness is from 200 to 500 Å, and is formed by the plasma CVD method.

Here, the via interlayer insulating film 212 is preferably an insulating film including at least silicon, oxygen, carbon, hydrogen or the like, film thickness is approximately from 1000 to 3000 Å, specific inductive capacity is 3.0 or less. Porous insulating film including at least silicon, oxygen, carbon, hydrogen formed according to the present invention may be used. For example, $SiO_2$, SiC, SiCN, HSQ (Hydrogen Silsesquioxane) film (e.g., Type 12 (registered trademark), MSQ (Methyl Silsesquioxane) film (e.g., JSR-LKD (registered trademark), ALCAP (registered trademark), NCS (registered trademark), IPS (registered trademark), HOSP (registered trademark), organic polymer film (SiLK (registered trademark), Flare (registered trademark), or SiOCH, SiOC (e.g., Black Diamond (registered trademark), CORAL (registered trademark), AuroralULK (registered trademark), Orion (registered trademark) or the like), or insulating thin film containing organic matters therein, or a film that is multiple lamination of any of them, or a film in which composition and density of any of film is changed in film thickness direction, are mentioned as typical examples.

Here, the wiring interlayer insulating film 213 is porous insulating film including at least silicon, oxygen, carbon, hydrogen formed according to the present invention. Film thickness is preferably approximately from 500 to 2000 Å.

Subsequently, as shown in FIG. 4(b), a dual damascene groove 214 is formed by patterning using photoresist and dry etching.

A dry etching method for porous insulating films 213, 212 employed here will be explained in detail. For example, a mixture of tetrafluoro carbon ($CF_4$) and argon (Ar) in flow rate ratio of 40:1000 is used as the etching gas, and etching can be carried out with the use of dry etching device of parallel flat plate type under conditions of source power 1000 W, source frequency 60 MHz, bias power 300 W, bias frequency 2 MHz, chamber pressure 50 m Torr (about 6.7 Pa), substrate temperature 20° C.

Subsequently, photo resist remained after etching is removed by $O_2$ ashing. On this occasion, since porous insulating film is susceptible to oxygen plasma, when direct exposure to $O_2$ ashing is not preferable, alternative method which does not expose porous insulating film to $O_2$ ashing (hard masking processing), or use of $N_2/H_2$ ashing, $He/H_2$ ashing is preferable. In some cases, a substrate may be heated to a temperature approximately from 150 to 250° C. for improvement of ashing rate.

Subsequently, as shown in FIG. 4(c), a metallic wiring material 210b and a barrier metal 215 are buried in the dual damascene groove 214, surplus wirings are removed by CMP method, thereby forming dual damascene wiring.

Here, the barrier metal film 215 can be formed using a sputtering method, a CVD method, an ALCVD (Atomic Layer Chemical Vapor Deposition) method, or the like. For example, high-melting point metals such as tantalum (Ta), tantalum nitride (TaN), titanium nitride (TiN), tungsten carbonitride (WCN), nitride thereof, or laminated film thereof are used. In particular, use of the laminated film of Ta/TaN (=upper layer/lower layer) is preferable.

Here, the metallic wiring material 210b can be formed by a sputtering method using Cu-target, a CVD method, or an electrolytic plating method in which Cu-film formed by these methods is used as the electrode. In addition, as for metallic element other than the main component, addition of at least one selected from a group including aluminum, tin, titanium, tungsten, silver, zirconium, indium, manganese, and magnesium is effective. Moreover, use of compound of metals other than Cu such as tungsten (W), CoWP, CoWB as the contact layer, or insertion of the same between Cu-wiring and insulating barrier film is also effective.

FIG. 5 shows one example of the structure of dual damascene wiring being formed as mentioned.

As shown in FIG. 5(a), the lower layer metallic wiring material includes a Ta/TaN barrier metal 215a and CuAl wiring 210a, Ta/TaN barrier metal is formed by the PVD method, and film thickness thereof is 15 nm/5 nm. The CuAl wiring 210a is composed primarily of Cu and includes Al 1.2 atm % or less therein. Top face of the lower layer metallic wiring is covered by an insulating barrier film 211a, and in this example, SiCN with specific inductive capacity of 4.9 being formed by the plasma CVD method is used.

In this example, Aurora-ULK (registered trademark) film formed by the plasma CVD method is used for a via interlayer insulating film 212b. For the wiring interlayer insulating film 213, porous insulating film with specific inductive capacity of 2.37 is used, while the method for forming used is shown in the exemplary embodiment 3 of the present invention. The via interlayer insulating film 212b and wiring interlayer insulating film 213 may be composed from the same material as long as sufficient workability is obtainable.

The upper layer wiring material includes, likewise the lower layer wiring material, a Ta/TaN barrier metal 215b and a CuAl wiring 210b, the Ta/TaN barrier metal is formed by the PVD method, and film thickness is 15 nm/5 nm. The CuAl wiring 210b is composed primarily of Cu and includes Al 1.2 atm % or less therein.

Top face of the upper layer wiring is covered by an insulating barrier film 211b, and in this example, SiCN film with specific inductive capacity of 4.9 being formed by the plasma CVD method was used.

FIG. 5(b) shows a structure where a hard mask film 216a is inserted to the structure shown in FIG. 5(a) at Cu-CMP for the purpose of protection of surface of the insulating film between wiring layers. As for the hard mask, silicon oxide film, silicon carbonized film, silicon-carbon-nitrogen film, or the like are mentioned, and the hard mask includes preferably higher specific inductive capacity than the wiring interlayer insulating film 213 and excellent mechanical strength. Therefore, SiOCH film or the like with specific inductive capacity of approximately 3.0 may be used. Structures other than this are omitted since they are identical with the structure shown in FIG. 5(a).

FIG. 5(c) shows a structure where etching stop films 217a, 217b are inserted to the structure shown in FIG. 5(b). Insertion of the etching stop film is attempted to improve workability of wiring groove including dual damascene shape and of via hole, alteration may be made depending on materials to be processed. If so, scattering of depth of wiring grooves may be reduced. Here, at least one of films including SiO may be used for the etching stop film, for example, $SiO_2$ film, SiN film, SiC film, SiCN film, SiOC film, SiOCH film, film containing organic matters thereto, film including primarily of organic matters, or film including primarily of organic matters.

With wiring structure as shown above, reduction in capacity between wirings can be attained. The inventors carried out a TDDB test between wirings using a comb type TEG including interval between wirings of 70 nm and confirmed that, under a temperature of 125° C. and application of electric field of 3 MV/cm, service life is 60 hours or more and sufficient TDDB resistance is developed.

If such forming steps of dual damascene wiring are repeated, forming of multilayer wiring as shown in FIG. 6 is made possible.

The present exemplary embodiment is explained in detail for the dual damascene structure as described above, while it is evident that the same can be applied to single damascene wiring.

Further, the present invention may be applied to every wiring structure of multilayer wiring composed of wiring structure, in which porous insulating film is used in part to interlayer insulating film, and every manufacturing method thereof, and possibility of utilization thereof is not limited in particular.

Although the present invention has been explained with reference to several preferred exemplary embodiments, it should be understood that these exemplary embodiments and examples are merely intended for explanation of the invention and do not constitute a limit of the invention.

For example, technologies used for manufacturing of semiconductors including CMOS circuit, that is the field of invention of the background of the invention, by the present inventors have been explained in greater detail, the present invention is not limited thereto and is also applicable to, for example, DRAM (Dynamic Random Access Memory), SRAM (Static Random Access Memory), flash memory, FRAM (Ferro Electric Random Access Memory), MRAM (Magnetic Random Access Memory), semiconductor product including memory circuit such as resistance variation type memory, semiconductor product including logic circuit such as microprocessor, or consolidated semiconductor product on which are mounted the articles simultaneously. Further, the present invention can be applied to semiconductor device including buried type alloy wiring structure to at least a part thereof, electronic circuit device, optical circuit device, quantum circuit device, micromachine, or the like.

It is apparent that, after reading the specification, many alterations and replacements can be made with ease using equivalent components and technologies by those skilled in the art. It is also apparent that these alterations and replacements do not depart from the true spirit and scope as set forth in the appended claims.

BRIEF DESCRIPTION OF THE DRAWINGS

FIG. 1 is a schematic diagram showing a film forming device of porous insulating film in a first exemplary embodiment of the present invention.

FIG. 4 is a drawing showing cross-section of a semiconductor device in an example of the present invention, wherein FIG. 4(a) is a cross-sectional view when each of materials is laminated, FIG. 4(b) is a cross-sectional view when patterning and dry etching are performed, FIG. 4(c) is a cross-sectional view of a semiconductor device upon completion when materials are buried in a groove formed in (b).

FIG. 5 is a drawing showing cross-section of the semiconductor structure in the example of the present invention, wherein FIG. 5(a) is a cross-sectional view of one example of structure of dual damascene wiring, FIG. 5(b) is a cross-sectional view when a hard mask film is inserted in the structure of (b), and FIG. 5(c) is a cross-sectional view when an etching stop film is inserted in the structure of (b).

Figure 2:
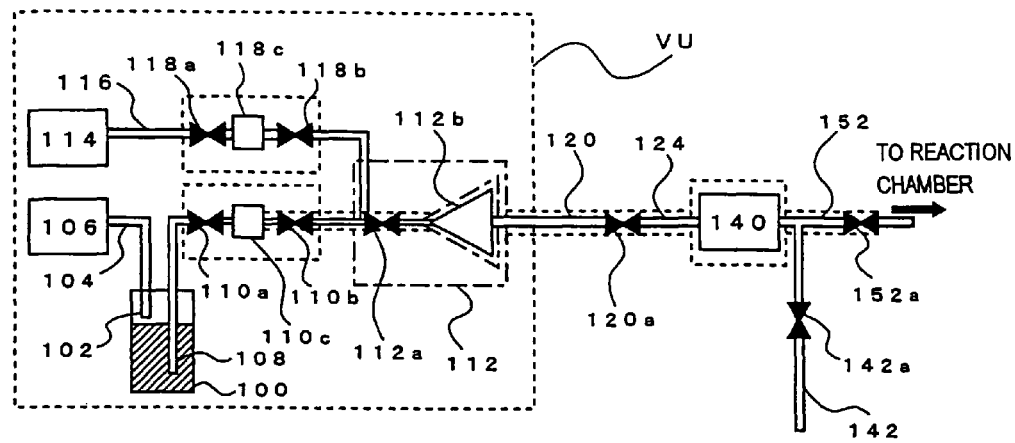
FIG. 2 is schematic diagram showing a mixed raw material supplying system of the film forming device of porous insulating film in a second exemplary embodiment of the present invention.
Figure 3:
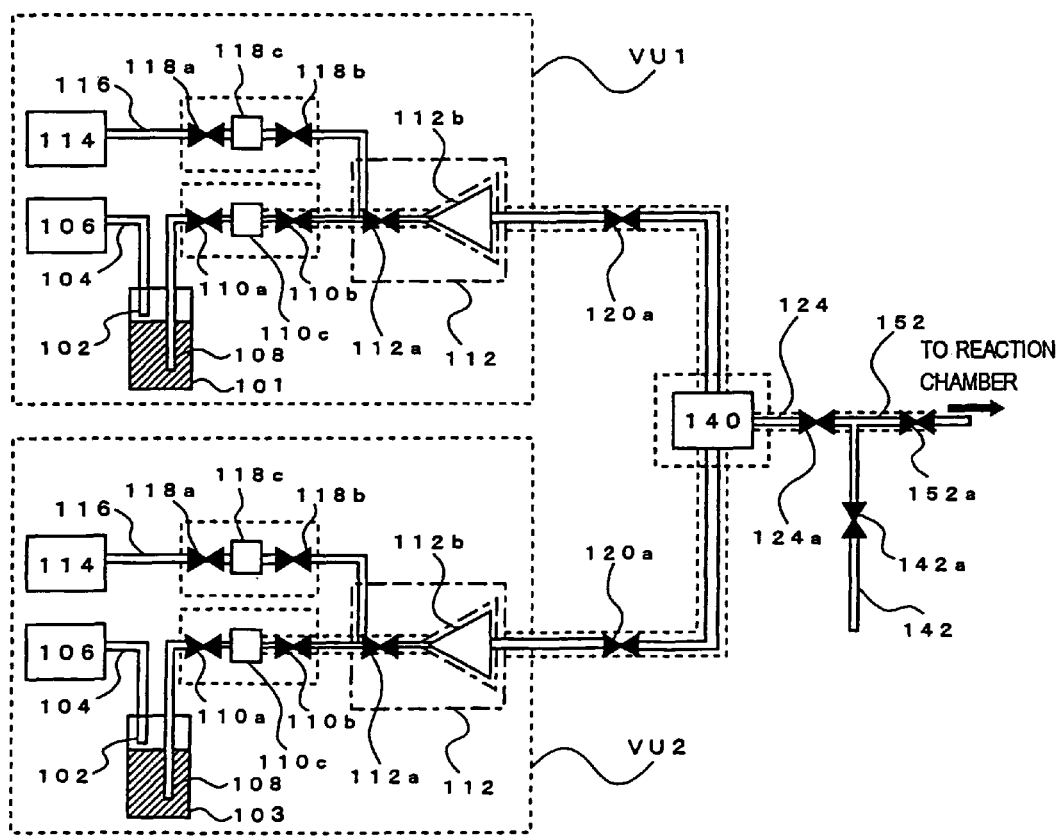
FIG. 3 is a schematic diagram showing a raw material supplying system of the film forming device of porous insulating film in a third exemplary embodiment of the present invention.
Figure 4:
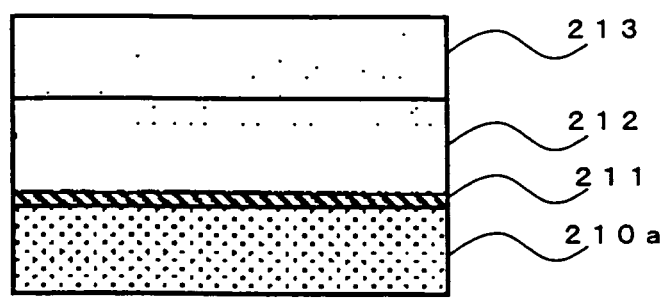
Figure 4:
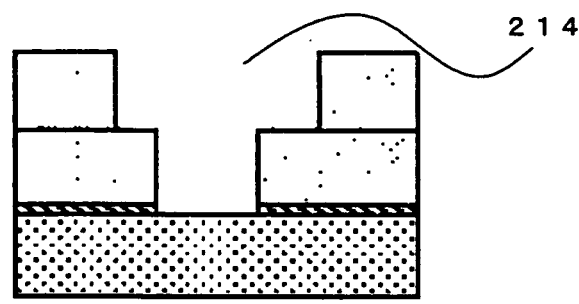
Figure 4:
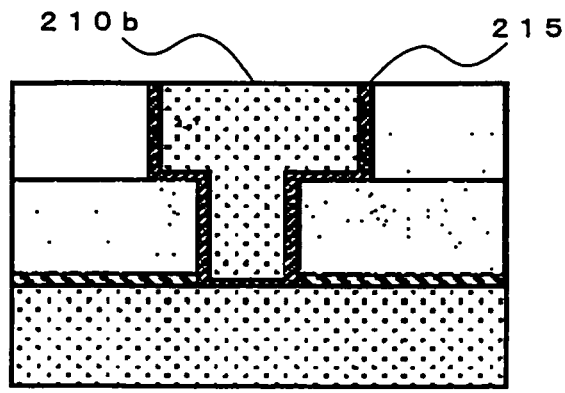
Figure 5:
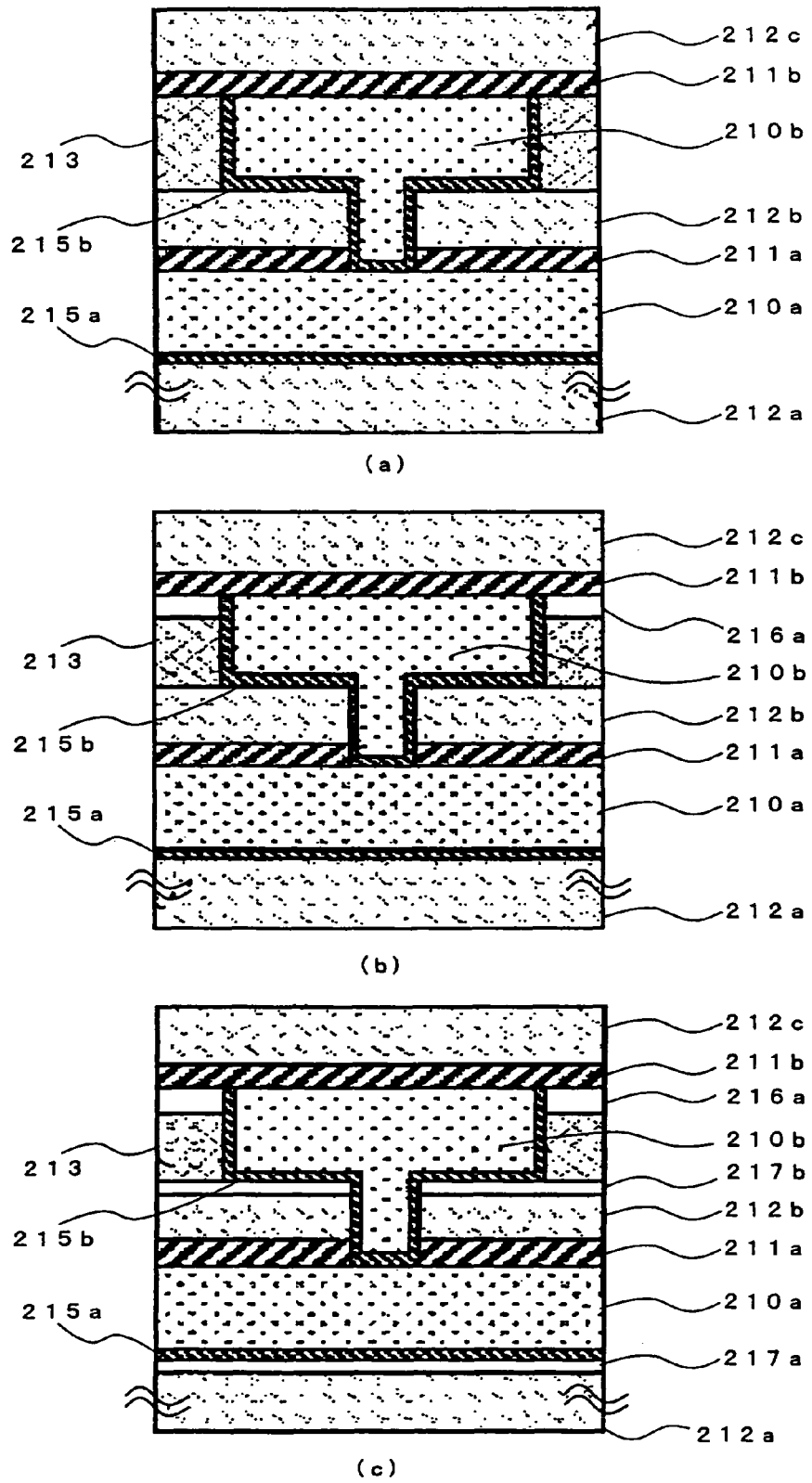
Figure 6:
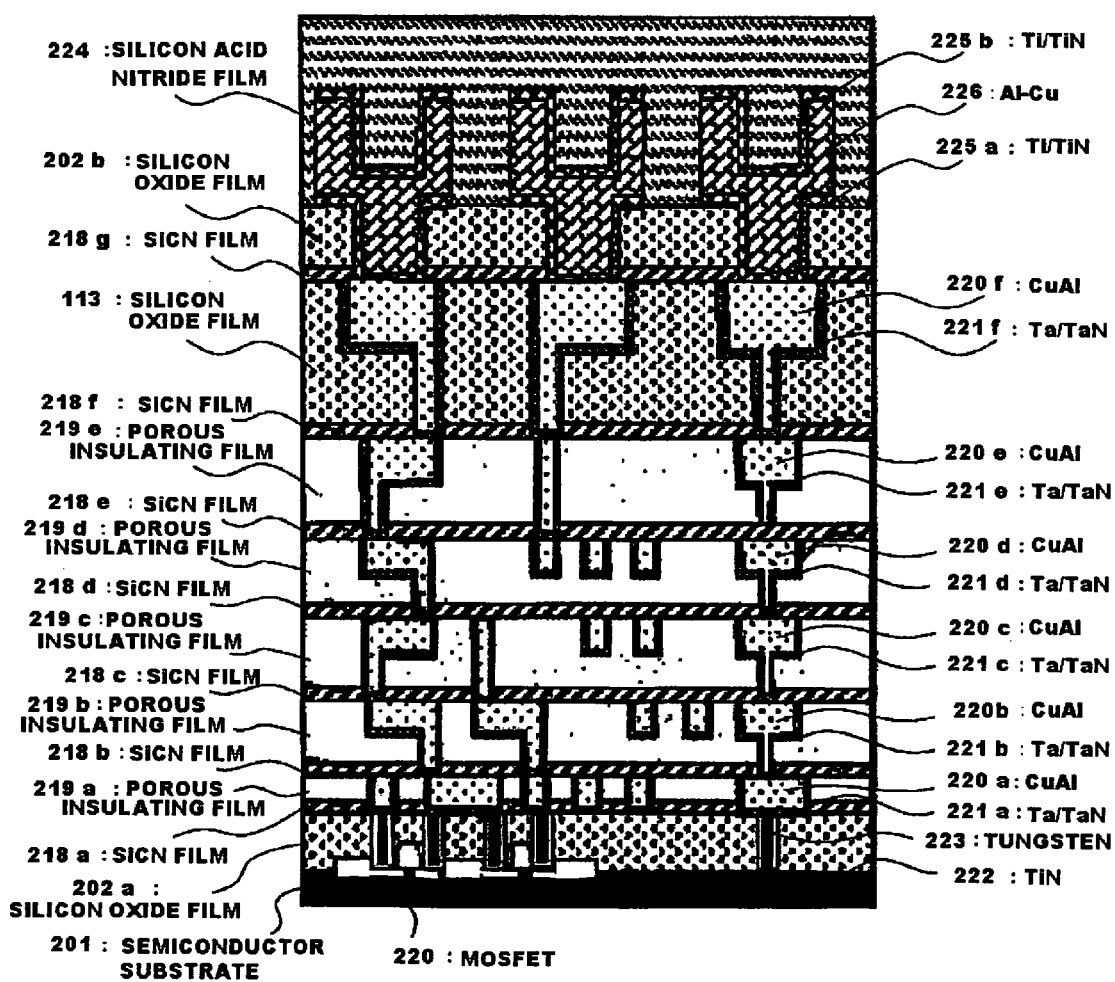
FIG. 6 is a drawing showing cross-section of the semiconductor device in the example of the present invention.

DESCRIPTION OF SYMBOLS 1 formed film member (semiconductor device)
2 Reaction chamber
3 Gas supplying section
50 Plasma CVD device
100 Mixed raw material of cyclic organosiloxane raw material in liquid state and compound raw material
101 Cyclic organosiloxane raw material in liquid state
102 Raw material tank
103 Compound raw material in liquid state
112 Vaporization section
112b Vaporizer
113 Silicon oxide film
200 MOSFET
201 Semiconductor substrate
202a, 202b Silicon oxide film 210a, 210b Metallic wiring material
211, 211a, 211b Insulating barrier film
212, 212a, 212b, 212c Via interlayer insulating film
213 wiring interlayer insulating film
214 Dual damascene groove
215, 215a, 215b Barrier metal film
216, 216a Hard mask film
217a, 217b Etching stop film
218a, 218b, 218c, 218d, 218e, 218f, 218g SiCN film
219a, 219b, 219c, 219d, 219e Porous insulating film
220a, 220b, 220c, 220d, 220e, 220f CuAl
221a, 211b, 221c, 221d, 221e, 221f Ta/TaN
222 TiN
223 Tungsten
224 Silicon acid nitride film
225a, 225b Ti/TiN
226 AlCu
VU, VU1, VU2 Vaporization control unit

The invention claimed is:

1. A method for forming a low dielectric porous insulating film, said method comprising:
 providing a plasma deposition device comprising:
  a reaction chamber;
  a vaporization section including a vaporizer; and
  a mixer formed between the vaporizer and the reaction chamber;
 heating a transfer pipe which transfers the liquid cyclic organosiloxane raw material and liquid compound raw material to the vaporizer;
 vaporizing a mixed raw material of a cyclic organosiloxane raw material and a compound raw material that comprises a reaction precursor of the cyclic organosiloxane raw material, in the vaporizer by reducing a pressure at an introduction section of the vaporization section and heating the vaporizer;
 after the vaporizing of the mixed raw material, mixing the vaporized raw material in a mixer to form a mixed gas of the cyclic organosiloxane raw material and the compound raw material;
 forming an insulating film by plasma vapor deposition method by supplying the mixed gas from the mixer to the reaction chamber; and
 before the supplying of the mixed gas from the mixer to the reaction chamber, supplying the compound raw material to the reaction chamber,
 wherein the vaporizing of the mixed raw material comprises setting a heating temperature in a temperature range from 80° C. to 120° C.,
 wherein the cyclic organosiloxane raw material includes a structure represented by Chemical Formula (4) shown below,
 wherein the compound raw material includes a structure represented by Chemical Formula (5) shown below, and
 wherein a mixing ratio of the mixed gas in a vaporized state of the cyclic organosiloxane raw material and the compound raw material is from 5 to 200% by volume for the compound raw material with regard to 100% by volume for the cyclic organosiloxane raw material,

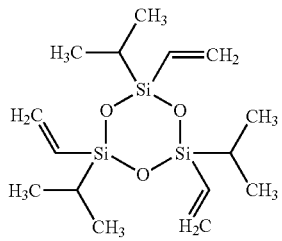
(Chemical formula (4))

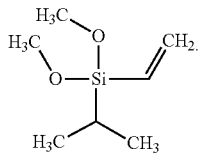
(Chemical formula (5))

2. The method for forming the low dielectric porous insulating film according to claim 1, wherein the reaction precursor of the cyclic organosiloxane raw material comprises at least hydrogen, carbon, oxygen, and silicon.

3. A method of forming an insulating film, comprising:
 providing a plasma deposition device comprising:
  a reaction chamber;
  a vaporization control unit connected to the reaction chamber, the vaporization control unit comprising a vaporization section including a vaporizer; and
  a mixer formed between the vaporization control unit and the reaction chamber;
 merging a carrier gas with liquid cyclic organosiloxane raw material and liquid compound raw material which is a reaction precursor of the liquid cyclic organosiloxane raw material;
 heating a transfer pipe which transfers the liquid cyclic organosiloxane raw material and liquid compound raw material to the vaporizer;
 vaporizing the liquid cyclic organosiloxane raw material and liquid compound raw material in the vaporizer of the vaporization control unit by reducing a pressure at an introduction section of the vaporization section and heating the vaporizer in a temperature range from 80° C. to 120° C.;
 after the vaporizing of the liquid cyclic organosiloxane raw material and the liquid compound raw material, mixing the vaporized cyclic organosiloxane raw material, the vaporized compound raw material and the carrier gas in the mixer;
 supplying the mixed vaporized cyclic organosiloxane raw material, vaporized compound raw material and carrier gas from the mixer to the reaction chamber, to form an insulating film on a semiconductor substrate disposed in the reaction chamber; and
 before the supplying of the mixed vaporized cyclic organosiloxane raw material, vaporized compound raw material and carrier gas from the mixer to the reaction chamber, supplying the vaporized compound raw material to the reaction chamber.

4. The method of claim 3, further comprising:
concurrently with the supplying of the mixed vaporized cyclic organosiloxane raw material, vaporized compound raw material and carrier gas, supplying high-frequency electric power to the reaction chamber.

5. The method of claim 3, wherein the vaporization control unit further comprises:

a raw material tank which stores liquid cyclic organosiloxane raw material and liquid compound raw material;
a liquid flow rate control section formed between the raw material tank and the vaporizer, and comprising:
a plurality of valves; and
a flow rate controller formed between the plurality of valves; and
a heater for heating the liquid flow rate control section.

6. The method of claim 5, wherein the transfer pipe transfers the liquid cyclic organosiloxane raw material and liquid compound raw material from the raw material tank to the vaporizer.

7. The method of claim 3, wherein the cyclic organosiloxane raw material includes a structure represented by Chemical Formula (4)

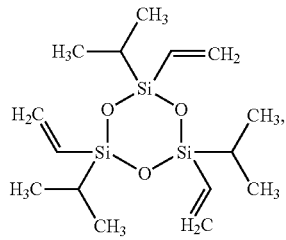

(Chemical formula (4))

wherein the compound raw material includes a structure represented by Chemical Formula (5)

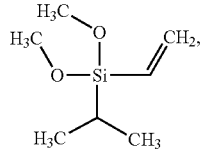

(Chemical formula (5))

and
wherein a mixing ratio of the mixed vaporized cyclic organosiloxane raw material, vaporized compound raw material and carrier gas, is from 5 to 200% by volume for the vaporized compound raw material with regard to 100% by volume for the vaporized cyclic organosiloxane raw material.

8. The method of claim 3, further comprising:
heating a transfer pipe which transfers the vaporized cyclic organosiloxane raw material, the vaporized compound raw material and the carrier gas from the vaporizer to the mixer.

9. The method of claim 3, wherein the plasma deposition device further comprises:
a gas exhaust pipe formed between the mixer and the reaction chamber; and
a heater for heating the mixer and gas exhaust pipe,
wherein the supplying of the mixed vaporized cyclic organosiloxane raw material, vaporized compound raw material and carrier gas from the mixer to the reaction chamber comprises supplying of the mixed vaporized cyclic organosiloxane raw material, vaporized compound raw material and carrier gas from the mixer to the reaction chamber in the heated gas exhaust pipe.

10. The method of claim 3, wherein the supplying of the mixed vaporized cyclic organosiloxane raw material, vaporized compound raw material and carrier gas, comprises supplying the mixed vaporized cyclic organosiloxane raw material, vaporized compound raw material and carrier gas such that a partial pressure of the vaporized cyclic organosiloxane raw material in the reaction chamber is in a range from 0.1 Torr to 3 Torr.

11. The method of claim 3, wherein the vaporization control unit further comprises:
a raw material tank which stores liquid cyclic organosiloxane raw material and liquid compound raw material; and
a pressurized gas supplying device which supplies pressurized gas into the raw material tank to increase an internal pressure of the raw material tank to cause the liquid cyclic organosiloxane raw material and liquid compound raw material to be transferred from the raw material tank to the vaporization section.

12. A method of forming an insulating film, comprising:
providing a plasma deposition device comprising:
a raw material tank which stores liquid cyclic organosiloxane raw material and liquid compound raw material which is a reaction precursor of the liquid cyclic organosiloxane raw material;
a reaction chamber;
a vaporization control unit connected to the reaction chamber, the vaporization control unit comprising a vaporization section including a vaporizer;
a pressurized gas supplying device which supplies pressurized gas into the raw material tank to increase an internal pressure of the raw material tank to cause the liquid cyclic organosiloxane raw material and liquid compound raw material to be transferred from the raw material tank to the vaporization section; and
a mixer formed between the vaporizer and the reaction chamber;
merging a carrier gas with the liquid cyclic organosiloxane raw material and the liquid compound raw material;
heating a transfer pipe which transfers the liquid cyclic organosiloxane raw material and liquid compound raw material to the vaporizer;
vaporizing the liquid cyclic organosiloxane raw material and liquid compound raw material in the vaporizer of the vaporization control unit by reducing a pressure at an introduction section of the vaporization section and heating in a temperature range from 80° C. to 120° C.;
heating a transfer pipe which transfers the vaporized cyclic organosiloxane raw material, the vaporized compound raw material and the carrier gas from the vaporizer to the mixer;
after the vaporizing of the liquid cyclic organosiloxane raw material and the liquid compound raw material, mixing the vaporized cyclic organosiloxane raw material, the vaporized compound raw material and the carrier gas in the mixer such that a mixing ratio of the vaporized cyclic organosiloxane raw material and the vaporized compound raw material is from 5 to 200% by volume for the vaporized compound raw material with regard to 100% by volume for the vaporized cyclic organosiloxane raw material;
heating a gas exhaust pipe which transfers the vaporized cyclic organosiloxane raw material, the vaporized compound raw material and the carrier gas from the mixer to the reaction chamber;
supplying the mixed vaporized cyclic organosiloxane raw material, vaporized compound raw material and carrier gas from the mixer to the reaction chamber in the heated gas exhaust pipe, such that a partial pressure of the vaporized cyclic organosiloxane raw material in the reaction chamber is in a range from 0.1 Torr to 3 Torr, to form an insulating film on a semiconductor substrate disposed in the reaction chamber; and before the supplying of the mixed vaporized cyclic organosiloxane raw material, vaporized compound raw material and carrier gas from the mixer to the reaction chamber, supplying the vaporized compound raw material to the reaction chamber.

\* \* \* \* \*